United States Patent
Wittenberg et al.

(10) Patent No.: US 9,648,744 B2
(45) Date of Patent: May 9, 2017

(54) EJECTABLE COMPONENT ASSEMBLIES IN ELECTRONIC DEVICES

(75) Inventors: Michael B. Wittenberg, Sunnyvale, CA (US); Miguel C. Christophy, San Francisco, CA (US); Shayan Malek, San Jose, CA (US)

(73) Assignee: APPLE INC., Cupertino, CA (US)

( * ) Notice: Subject to any disclaimer, the term of this patent is extended or adjusted under 35 U.S.C. 154(b) by 228 days.

(21) Appl. No.: 13/610,701

(22) Filed: Sep. 11, 2012

(65) Prior Publication Data
US 2014/0029206 A1 Jan. 30, 2014

Related U.S. Application Data

(60) Provisional application No. 61/675,328, filed on Jul. 24, 2012.

(51) Int. Cl.
| | |
|---|---|
| *H05K 1/18* | (2006.01) |
| *G06F 1/16* | (2006.01) |
| *H05K 7/02* | (2006.01) |
| *H05K 3/00* | (2006.01) |
| *H05K 3/30* | (2006.01) |
| *G06K 13/08* | (2006.01) |
| *H05K 1/11* | (2006.01) |

(52) U.S. Cl.
CPC .............. *H05K 1/18* (2013.01); *G06F 1/1658* (2013.01); *G06K 13/0825* (2013.01); *H05K 1/183* (2013.01); *H05K 3/00* (2013.01); *H05K 3/30* (2013.01); *H05K 7/02* (2013.01); *H04M 2250/14* (2013.01); *H05K 1/117* (2013.01); *H05K 2201/09036* (2013.01); *H05K 2201/09063* (2013.01); *H05K 2201/09163* (2013.01); *Y10T 29/4913* (2015.01); *Y10T 29/49124* (2015.01)

(58) Field of Classification Search
CPC ......... H05K 1/183; H05K 2201/09036; H05K 2201/09163; G06F 1/1658; H04M 2250/14
USPC ................................ 361/754, 756, 760, 761
See application file for complete search history.

(56) References Cited

U.S. PATENT DOCUMENTS

| | | | | |
|---|---|---|---|---|
| 5,219,292 | A * | 6/1993 | Dickirson et al. | 439/67 |
| 5,386,343 | A * | 1/1995 | Pao | 361/761 |
| 5,403,202 | A * | 4/1995 | Roehling | 439/493 |
| 5,455,742 | A * | 10/1995 | Phoy et al. | 361/778 |
| 5,920,465 | A * | 7/1999 | Tanaka | 361/784 |
| 6,104,464 | A * | 8/2000 | Adachi et al. | 349/150 |
| 6,324,067 | B1 * | 11/2001 | Nishiyama | 361/761 |
| 6,409,529 | B1 * | 6/2002 | Liu et al. | 439/188 |
| 6,623,305 | B2 * | 9/2003 | Chun-Lung | 439/630 |
| 6,982,394 | B2 * | 1/2006 | Ide et al. | 200/516 |

(Continued)

*Primary Examiner* — Adrian S Wilson
(74) *Attorney, Agent, or Firm* — Brownstein Hyatt Farber Schreck, LLP

(57) ABSTRACT

Electronic devices are provided with ejectable component assemblies. Each ejectable component assembly may include a tray that can be loaded with one or more types of removable module, such as a mini-SIM card and a micro-SIM card, and inserted into the device. Each assembly may also include a cover coupled to a circuit board. The tray may be inserted through an opening in the electronic device and into a space between the cover and the circuit board. A portion of the space is contained within the pocket. A portion of the tray may be contained within the pocket when the tray is inserted into the device for holding the module at a functional insertion position within the device.

17 Claims, 9 Drawing Sheets

(56) References Cited

U.S. PATENT DOCUMENTS

| | | | |
|---|---|---|---|
| 7,066,748 B2* | 6/2006 | Bricaud et al. | 439/159 |
| 7,232,315 B2* | 6/2007 | Uchida et al. | 439/67 |
| 7,320,607 B2* | 1/2008 | Kim et al. | 439/76.1 |
| 7,350,326 B2* | 4/2008 | Hu | 40/544 |
| 7,382,625 B2* | 6/2008 | Thornton et al. | 361/737 |
| 7,530,852 B2* | 5/2009 | Hu et al. | 439/630 |
| 7,665,206 B2* | 2/2010 | Park et al. | 29/829 |
| 7,713,092 B2* | 5/2010 | Kim et al. | 439/660 |
| 8,000,743 B2* | 8/2011 | Tang | 455/558 |
| 8,270,175 B2* | 9/2012 | Duan et al. | 361/737 |
| 8,339,798 B2* | 12/2012 | Minoo et al. | 361/764 |
| 8,371,878 B2* | 2/2013 | Tang | 439/630 |
| 8,462,514 B2* | 6/2013 | Myers et al. | 361/754 |
| 8,553,419 B2* | 10/2013 | Luo et al. | 361/727 |
| 8,564,965 B2* | 10/2013 | Sloey et al. | 361/752 |
| 8,605,451 B2* | 12/2013 | Tang | 361/754 |
| 8,642,896 B2* | 2/2014 | Fukuzono | 174/260 |
| 8,923,003 B2* | 12/2014 | Schlaupitz et al. | 361/749 |
| 2002/0118826 A1* | 8/2002 | Kiernan et al. | 379/433.09 |
| 2004/0092149 A1* | 5/2004 | Scuteri et al. | 439/326 |
| 2006/0046544 A1* | 3/2006 | Ujii et al. | 439/159 |
| 2006/0234521 A1* | 10/2006 | Uchida et al. | 439/55 |
| 2008/0165508 A1* | 7/2008 | Wang et al. | 361/728 |
| 2008/0316684 A1* | 12/2008 | Kilpinen | 361/679 |
| 2009/0047835 A1* | 2/2009 | Lin | 439/632 |
| 2009/0124216 A1* | 5/2009 | Lintern et al. | 455/90.1 |
| 2009/0275237 A1* | 11/2009 | Chiang | 439/629 |
| 2010/0097774 A1* | 4/2010 | Clancy et al. | 361/760 |
| 2010/0170700 A1* | 7/2010 | Nakamura et al. | 174/254 |
| 2010/0226101 A1* | 9/2010 | Yeates et al. | 361/748 |
| 2011/0189869 A1* | 8/2011 | Li | 439/76.1 |
| 2011/0194263 A1* | 8/2011 | Shen et al. | 361/754 |
| 2011/0255252 A1* | 10/2011 | Sloey et al. | 361/752 |
| 2012/0075817 A1* | 3/2012 | Yeates et al. | 361/760 |
| 2012/0195013 A1* | 8/2012 | Trzaskos et al. | 361/754 |
| 2013/0235540 A1* | 9/2013 | Chang | 361/754 |

* cited by examiner

EJECTABLE COMPONENT ASSEMBLIES IN ELECTRONIC DEVICES

CROSS-REFERENCE TO RELATED APPLICATION

This application claims the benefit of prior filed U.S. Provisional Patent Application No. 61/675,328, filed Jul. 24, 2012, which is incorporated by reference herein in its entirety.

FIELD OF THE INVENTION

This can relate to systems and methods for providing ejectable component assemblies in electronic devices and, more particularly, to systems and methods for embedding ejectable component assemblies in circuit boards of electronic devices.

BACKGROUND OF THE DISCLOSURE

To enhance the use of electronic devices (e.g., cellular telephones), ejectable component assemblies may be used to couple removable modules (e.g., subscriber identity module ("SIM") cards) to the device. Some known ejectable component assemblies for personal electronic devices include a tray for receiving a removable module, and a connector coupled to a top surface of a circuit board within the housing of the device for receiving the tray as it is inserted through an opening in the housing. The connector may retain the tray such that contacts of the module may be electrically coupled to the circuit board. However, stacking such a connector above the top surface of the circuit board may limit the reduction in size of such electronic devices.

SUMMARY OF THE DISCLOSURE

Systems and methods for providing ejectable component assemblies in electronic devices are provided.

For example, in some embodiments, there is provided an electronic device that may include a housing having an opening. The electronic device may also include a circuit board having a top surface, a bottom surface, and a pocket through the top surface that may expose a middle surface of the circuit board between the top surface and the bottom surface. The electronic device may also include a cover coupled to the circuit board, and a removable module operable to be inserted through the opening and into a space between the cover and the circuit board, where a portion of the space is within the pocket.

In other embodiments, there is provided a circuit board that may include a top surface, a bottom surface, and a middle surface positioned between the top surface and the bottom surface. The circuit board is configured to receive at least a first portion of a subscriber identity module in a space between the top surface and the middle surface.

In other embodiments, there is provided a method that may include forming a recess through a top surface of a circuit board for exposing a middle surface of the circuit board positioned between the top surface and a bottom surface of the circuit board. The method may also include coupling a cover to the circuit board for defining a space between the cover and the middle surface that is configured to receive a removable module.

BRIEF DESCRIPTION OF THE DRAWINGS

The above and other aspects of the invention, its nature, and various features will become more apparent upon consideration of the following detailed description, taken in conjunction with the accompanying drawings, in which like reference characters may refer to like parts throughout, and in which.

DETAILED DESCRIPTION OF THE DISCLOSURE

Figure 1:
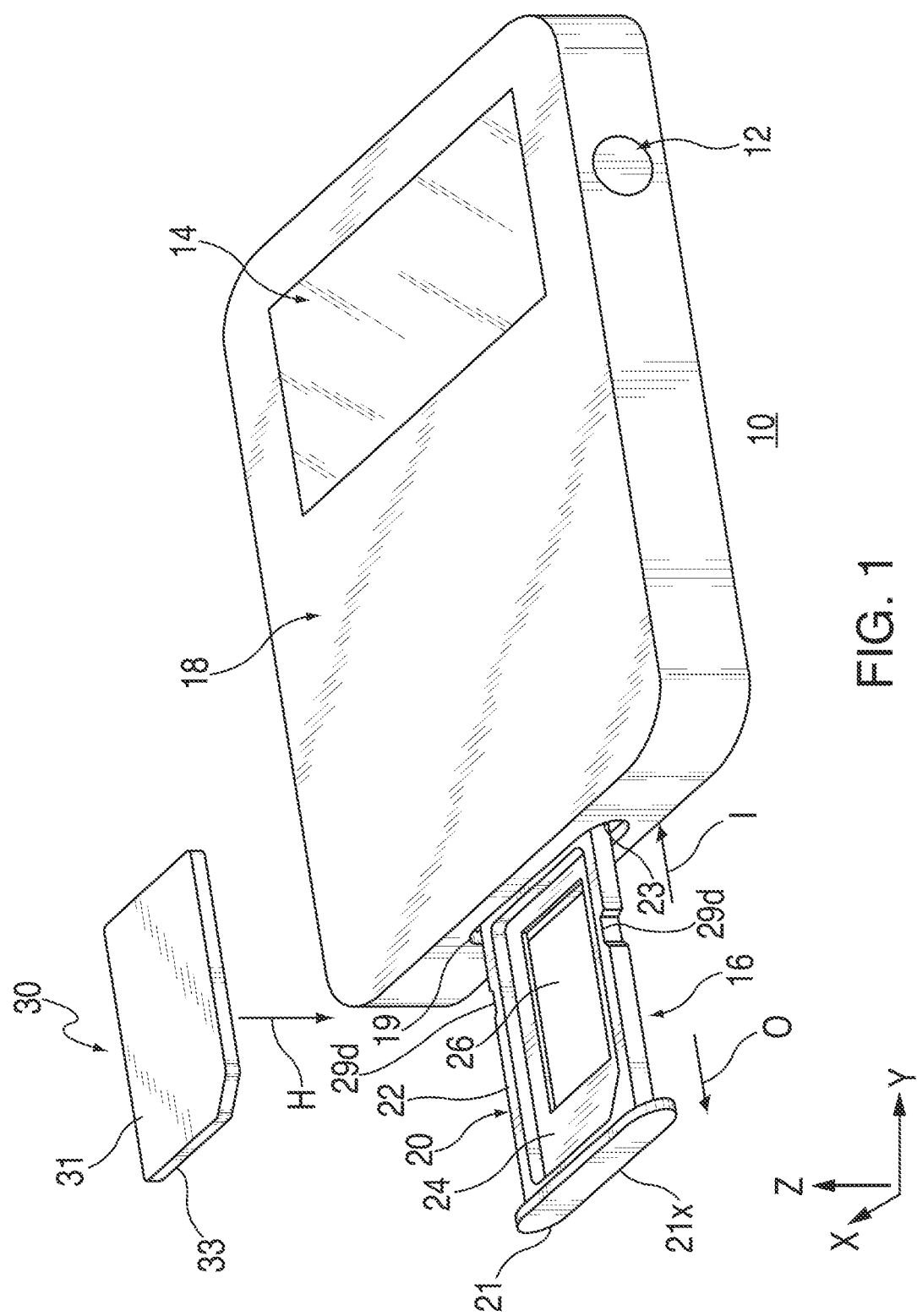
FIG. 1 is a perspective view of an illustrative electronic device that includes an ejectable component assembly, with a removable module at least partially ejected therefrom, in accordance with some embodiments of the invention.
Figure 2:
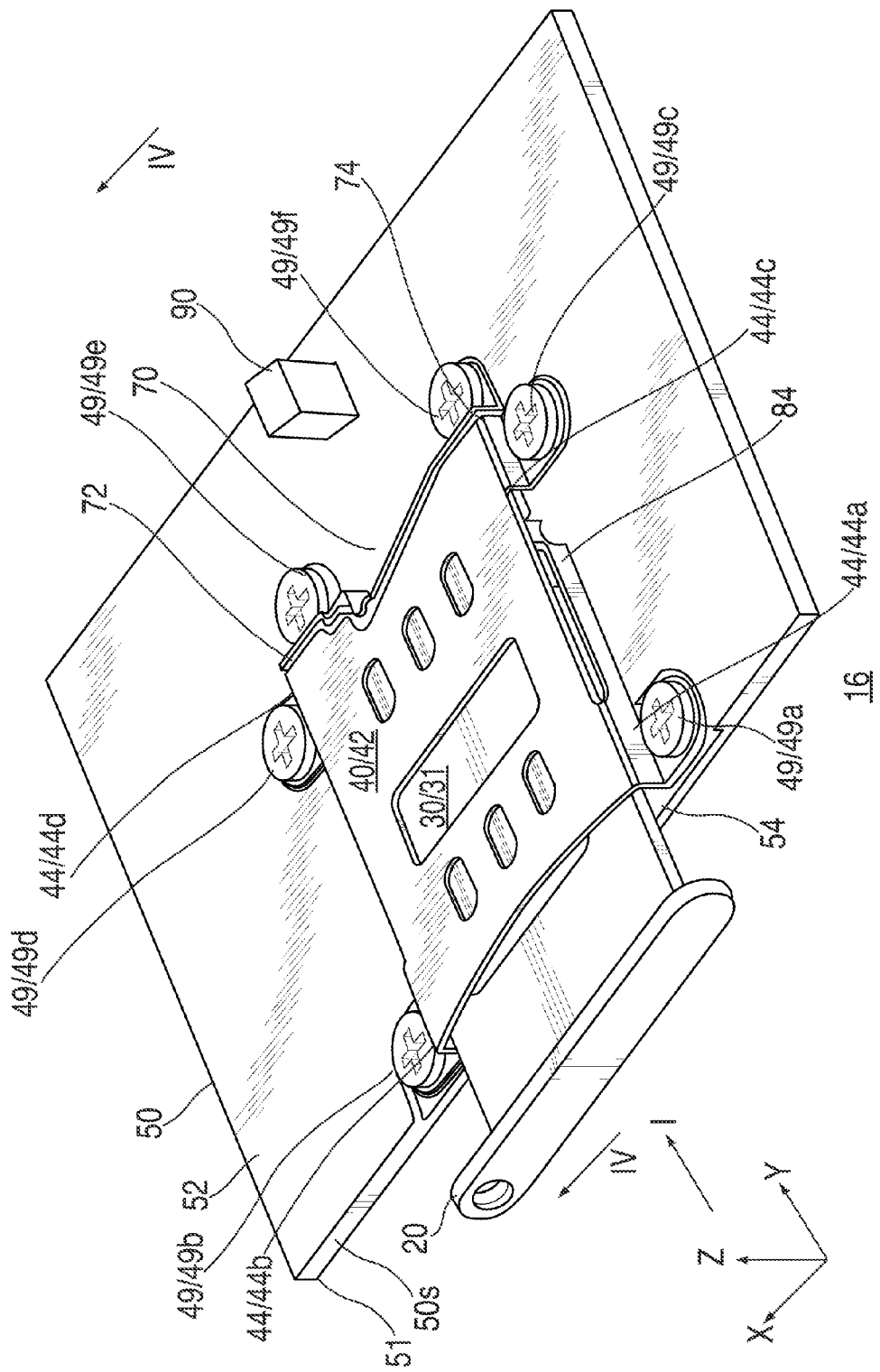
FIG. 2 is a perspective view of the ejectable component assembly and a portion of the electronic device of FIG. 1, but with the removable module fully inserted therein, in accordance with some embodiments of the invention.
Figure 3:
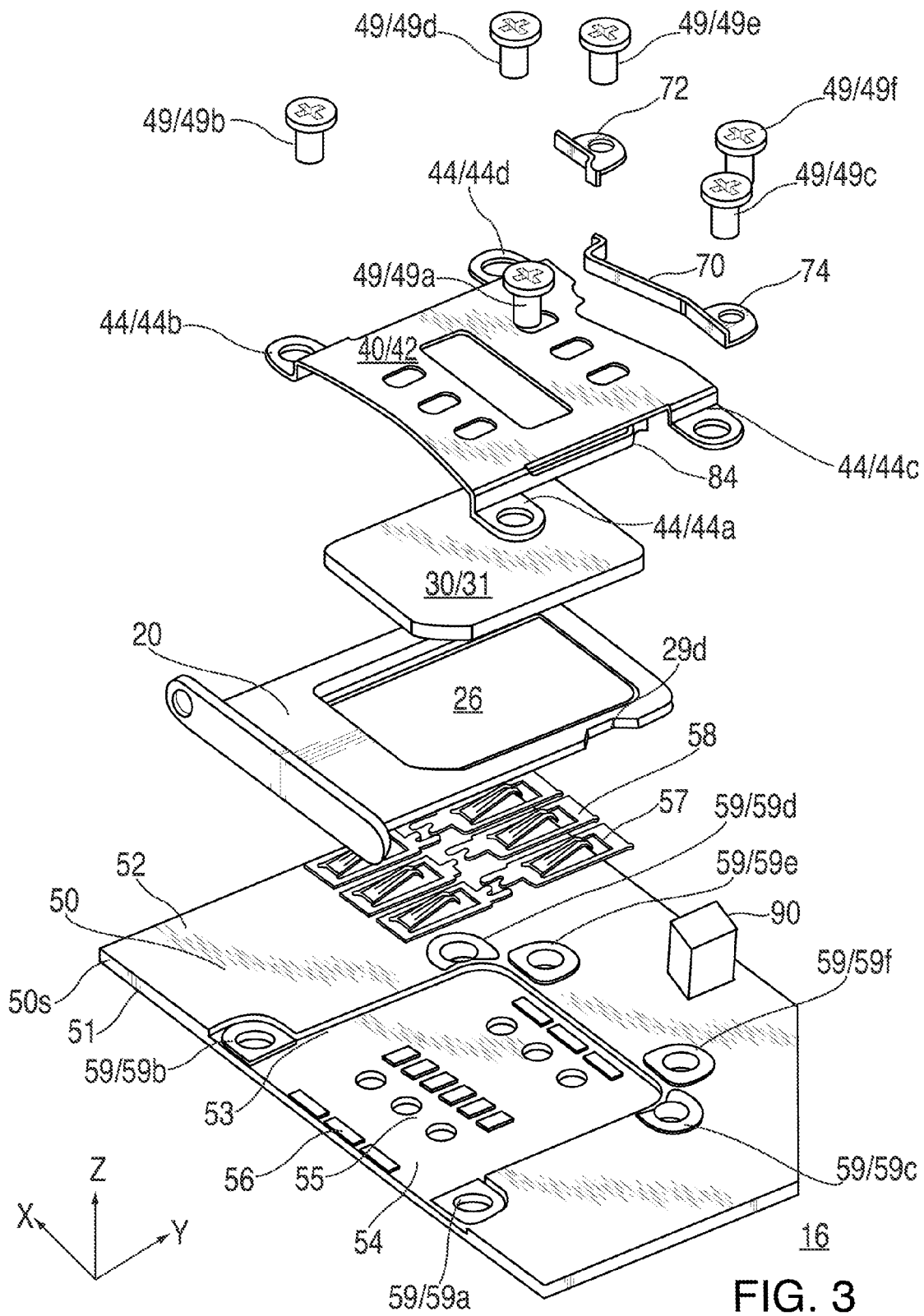
FIG. 3 is an perspective view of the ejectable component assembly and electronic device of FIGS. 1 and 2, similar to FIG. 2, but exploded for clarity, in accordance with some embodiments of the invention.
Figure 4:
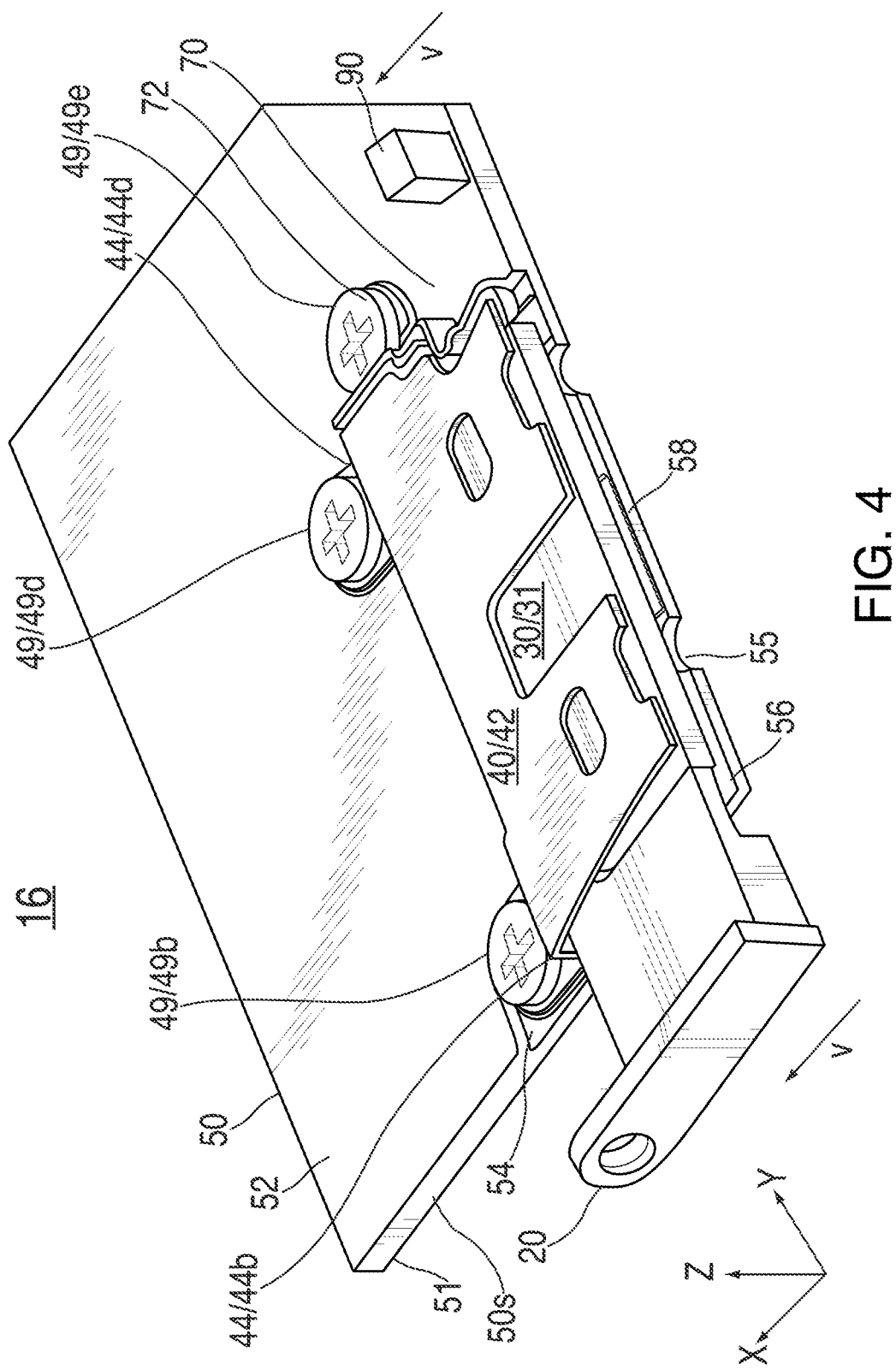
FIG. 4 is a perspective cross-sectional view of the ejectable component assembly and electronic device of FIGS. 1-3, taken from line IV-IV of FIG. 2, in accordance with some embodiments of the invention.

Systems and methods for providing ejectable component assemblies in electronic devices are provided and described with reference to FIGS. 1-9.

An ejectable component assembly may include any suitable assembly operative to insert into an electronic device and eject from an electronic device a removable module, such as a subscriber identity module ("SIM") card. The assembly can include a module tray that may hold the module and be insertable into and ejectable from the device. The tray may include a cosmetic outer portion that may be configured to match the exterior of the electronic device through which the tray may be inserted, and a holder inner portion that may be configured to retain the module and load it into the electronic device.

Electrical contacts of the removable module may be inserted into the device in order to functionally align with and electrically couple to electrical contacts extending from a circuit board of the device. In some embodiments, one or more detents may be provided through the circuit board or other components of the device such that when the removable module physically interacts with the contacts, at least a portion of the contacts may be forced downwardly through the detents. These detents may prevent the contacts from being damaged during interaction with the module and/or during removal of the module from the device.

The circuit board may be pocketed with a recess formed in through a top surface of the circuit board such that a middle surface of the circuit board may be exposed by the recess. Portions of the ejectable component assembly (e.g., a cover and/or electrical pins or spring contacts for coupling to the removable module) may be directly soldered to portions of the circuit board exposed by the recess. When the removable module is inserted into the device, at least a portion of the removable module may be positioned within the recess or pocket of the circuit board (e.g., below a top surface of the circuit board). This may allow the device to have a reduced geometry (e.g., to have a reduced height).

The following discussion describes various embodiments of an electronic device that includes at least one ejectable component assembly. The term "electronic device" can include, but is not limited to, music players, video players, still image players, game players, other media players, music recorders, video recorders, cameras, other media recorders, radios, medical equipment, calculators, cellular telephones, other wireless communication devices, personal digital assistants, remote controls, pagers, laptop computers, desktop computers, tablets, servers, printers, or combinations thereof. In some cases, the electronic device may perform a single function (e.g., an electronic device dedicated to conducting telephone calls) and in other cases, the electronic device may perform several functions (e.g., an electronic device that plays music, displays video, stores pictures, and receives and transmits telephone calls).

The electronic devices may generally be any portable, mobile, hand-held, or miniature electronic device so as to allow a user, for example, to listen to music, play games, record videos, take pictures, and/or conduct communications operations (e.g., telephone calls) wherever he or she travels. Some miniature electronic devices may have a form factor that is smaller than that of hand-held electronic devices, such as an iPod™ available by Apple Inc. of Cupertino, Calif. Illustrative miniature electronic devices can be integrated into various objects that include, but are not limited to, watches, rings, necklaces, belts, accessories for belts, headsets, accessories for shoes, virtual reality devices, other wearable electronics, accessories for sporting equipment, accessories for fitness equipment, key chains, or any combination thereof. Alternatively, electronic devices that incorporate an ejectable component assembly may not be portable at all.

FIG. 1 is a perspective view of an illustrative electronic device 10 that may include an ejectable component assembly in accordance with some embodiments of the invention. Electronic device 10 can include at least one user input component assembly 12 that may allow a user to interface with device 10, at least one device output component assembly 14 that may provide the user with information generated by device 10, at least one ejectable component assembly 16 that may allow a user to insert and eject a removable module into and from device 10, and a protective housing 18 that may at least partially enclose the one or more input, output, and ejectable component assemblies of device 10.

Component assemblies 12 and 14 can include any type of component assembly operative to receive and/or transmit digital and/or analog data (e.g., audio data, video data, other types of data, or a combination thereof). Input component assembly 12 may include any suitable input mechanism, such as, for example, sliding switches, buttons, keypads, track balls, joysticks, dials, scroll wheels, touch screen displays, electronics for accepting audio and/or visual information, antennas, infrared ports, or combinations thereof. Output component assembly 14 may include any suitable output component forms, such as, for example, audio speakers, headphones, audio line-outs, visual displays, antennas, infrared ports, rumblers, vibrators, or combinations thereof. It should be noted that one or more input component assemblies 12 and one or more output component assemblies 14 may sometimes be referred to collectively herein as an input/output ("I/O") interface. It should also be noted that an input component assembly 12 and an output component assembly 14 may sometimes be a single I/O component, such as a touch screen that may receive input information through a user's touch of a display screen and that may also provide visual information to a user via that same display screen.

Ejectable component assembly 16 may include any suitable assembly operative to insert and eject a removable module 30 from device 10. Removable module 30 may include, for example, any suitable type of integrated circuit card ("ICC"), chip card, memory card, flash memory card, microprocessor card, smart card, such as a subscriber identity module ("SIM") card (e.g., a mini-SIM card or a micro-SIM card), or combinations thereof. Removable module 30 may have a top surface 31 and a bottom surface 33. In some embodiments, removable module 30 may contain electronic circuitry (e.g., on bottom surface 33) from which electronic device 10 may read data and/or to which device 10 may write data.

Ejectable component assembly 16 can include a module tray 20 that may be insertable into (e.g., in the direction of arrow I) and ejectable from (e.g., in the direction of arrow O) housing 18 through housing opening 19. It is to be noted that although opening 19 is shown in FIG. 1 to be provided through a wall that may be defining a width of housing 18 (e.g., along axis X), opening 19 for ejectable component assembly 16 may be provided through any wall portion of housing 18. For example, in some embodiments, opening 19 for ejectable component assembly 16 may be provided through a wall that may be defining a length of housing 18 (e.g., along axis Y), which may be longer than the wall defining the width of housing 18 (e.g., the wall of housing 18 along which input component assembly 12 is provided as shown in FIG. 1).

Tray 20 of ejectable component assembly 16 may include a body portion 22 extending between a first tray end 21 and a second tray end 23. Tray 20 may include an outer surface 21x at first end 21 to provide a cosmetic surface for device 10 when tray 20 is inserted into device 10. In some embodiments, outer surface 21x of tray 20 may be fashioned to be aesthetically pleasing to a user of device 10, for example, by matching the color and/or material of surface 21x with that of the exterior surface of housing 18 about opening 19. First tray end 21, second tray end 23, and/or body portion 22 may define the periphery and/or walls of a module holder 24. Module holder 24 may be operative to receive and hold removable module 30 with respect to tray 20 (e.g., when module 30 is inserted into holder 24 in the direction of arrow H). More particularly, module holder 24 may be operative to receive and hold removable module 30 with respect to an opening 26 that may be provided through a portion of tray 20.

Tray 20 may be formed as a single unitary component from any suitable material, such as plastic, glass, metal, ceramic materials, epoxies, composite materials, or the like. Moreover, tray 20 may be a single unitary component made by any suitable process, such as casting, molding, forming, forging, machining, extruding, and the like. Alternatively, tray 20 may be formed by joining at least two distinct tray portions. Holder 24 can be sized to substantially match that of removable module 30, such that module 30 can be snap-fitted or otherwise releasably retained in holder 24, and such that a portion of module 30 may be exposed through opening 26. For example, opening 26 may allow electrical circuitry of electronic device 10 to access data from one or more electrical contacts of module 30 (e.g., electrical contacts on bottom surface 33 of module 30) through opening 26 when tray 20 is partially or fully inserted into device 10.

In some embodiments, tray 20 may also include one or more detents 29d that may be placed on the top, bottom, or various sides of tray 20. For example, as shown in FIG. 1, each side of tray 20 may include at least one detent 29d between end 21 and end 23. As described below, detents 29d may interact with biasing mechanisms of assembly 16 (e.g., biasing mechanisms 84) within device 10 in order to retain tray 20 in a functional position with device 10. The depth of each detent 29d may be selected based on any suitable criteria, including, for example, such that detent 29d may receive a portion of a biasing mechanism for securing tray 20 in a functional position.

As mentioned, tray 20 may be configured to receive and retain any suitable module for insertion into device 10, such as an integrated circuit card, chip card, memory card, flash memory card, microprocessor card, smart card, such as a SIM card, and the like. As shown, module 30 may include a top surface 31 and a bottom surface 33. One or more electrical contacts may be exposed along bottom surface 33. Therefore, when bottom surface 33 of module 30 is placed within holder 24 of tray 20, at least a portion of some or all of the electrical contacts along bottom surface 33 may be exposed through opening 26 of tray 20 (see, e.g., FIG. 5).

FIGS. 2-6 are views of a portion of device 10 including ejectable component assembly 16 once tray 20 has been inserted into electronic device 10. As shown, ejectable component assembly 16 may include a cage or connector or cover 40 positioned at least partially above a circuit board 50 and operative to receive and/or restrain tray 20 at least partially above circuit board 50 (e.g., at least partially within a space defined between cover 40 and board 50). For example, as shown, cover 40 can include a top portion 42 that may be positioned above a top surface 52 of circuit board 50. In some embodiments, top portion 42 may be substantially parallel to top surface 52 of circuit board 50. In some embodiments, cover 40 may include one or more legs 44 extending downwardly from top portion 42, and a free end of each one of legs 44 may be coupled to circuit board 50 for holding top portion 42 above circuit board 50 (e.g., for defining a space between circuit board 50 and top portion 42 for receiving tray 20). For example, as shown, cover 40 may include four legs 44 (e.g., legs 44a, 44b, 44c, and 44d). Module 30 may be placed in tray 20 and tray 20 may be slid through housing opening 19 in the direction of arrow I and into the space defined between top cover portion 42, legs 44, and circuit board 50.

Circuit board 50 may be any type of circuit board, such as a printed circuit board ("PCB"), logic board, printed wiring board, etched wiring board, or any other suitable board that may be used to mechanically support and electronically connect various electrical components (e.g., component assemblies 12, 14, and 16). Circuit board 50 can be constructed using one or more layers of a non-conductive substrate and signal conducting pathways. The signal conducting pathways may exist in one or more layers or in each layer of the non-conductive substrate. The signal conducting layers, sometimes referred to as traces, members, or leads, may be a metal conductive material (e.g., copper or gold) or an optical conductive material (e.g., fiber optics). When one or more portions of component assemblies 12, 14, and 16 are electrically coupled to board 50 (e.g., via coupling circuitries), board 50 may communicate with the one or more component assemblies of device 10 using the signal conducting layers. For example, an electronic component 90 may be coupled to top surface 52 of circuit board 100. Component 90 may be a portion or all of one of component assemblies 12 and 14.

Cover 40 may be formed of any suitable material, such as plastic, glass, metal, ceramic materials, epoxies, composite materials, and the like. For example, cover 40 may be formed from sheet metal that may be directly coupled to board 50. Cover 40 may be coupled to any suitable component of assembly 16 and/or device 10, such as circuit board 50, using any suitable approach, including, for example, soldering, surface mount technology, welding, adhesives, and the like. For example, as shown, cover 40 may be coupled to circuit board 50 or any other suitable component of device 10 by one or more coupling elements 49 (e.g., screws, solder, adhesives, mechanical tabs or latches, etc.). For example, in some embodiments, four coupling elements 49a, 49b, 49c, and 49d may couple each one of respective legs 44a, 44b, 44c, and 44d to circuit board 50. Each leg 44 may be coupled to circuit board 50 (e.g., at one or more respective circuit board couplings 59 (e.g., copper ground pads)) via a coupling element 49. For example, each circuit board coupling 59 may be electrically coupled to a ground plane of circuit board 50 for grounding cover 40. As shown, each one of legs 44a, 44b, 44c, and 44d may be coupled to a respective circuit board coupling 59a, 59b, 59c, and 59d via a respective coupling element 49a, 49b, 49c, and 49d.

Assembly 16 may also include one or more electrical signal pins 58 that may electrically couple with one or more conductive portions of module 30 (e.g., module electrical contacts on bottom 33 of module 30). For example, as shown, one or more electrical pins 58 may each be electrically coupled to circuit board 50 (e.g., at one or more respective circuit board couplings 56 (e.g., copper signal pads via solder)). Each electrical pin 58 may be directly soldered or otherwise connected to a circuit board coupling 56. Each circuit board coupling 56 may be electrically coupled to an appropriate electrical via of circuit board 50. Each electrical pin 58 may also include a free end 57 that may be configured to extend up away from circuit board 50 and into tray opening 26 for electrically coupling with a respective electrical contact of module 30. Electrical contacts of module 30 can include any suitable integrated circuit ("IC"), such as a microchip, silicon chip, or computer chip that may include semiconductor and/or passive components in the surface of a thin substrate of semiconductor material (e.g., on bottom surface 33 of module 30). The electrical contact between module contacts of module 30 and electrical pins 58 may allow device 10 to read data from and/or write data into module 30. The data read from and/or written into module 30 may take any electrical form, and the communication between module 30 and device 10 may be synchronous or asynchronous.

Electrical pins 58 may have any suitable shape. For example, each electrical pin 58 may be biased to deflect upward away from circuit board 50 and through opening 26 in tray 20. Electrical pins 58 may include springs or wedges operative to contact module 30. For example, electrical pins 58 may be coupled to any suitable location or portion of circuit board 50 to form a cantilever spring. Each electrical pin 58 may be formed from any suitable conductive material (e.g., a metallic conductor, semiconductor, or superconductor) to communicate with electrical contacts of module 30. In some embodiments, as shown, at least a first portion of each electrical pin 58 may be coupled to circuit board 50 at a circuit board coupling 56, such that electrical data may be communicated between module 30 and board 50 through pin 58. Circuit board 50 may then communicate this data to various other components of device 10 (e.g., component assemblies 12 and/or 14).

Although each pin 58 may at least initially extend away from circuit board 50 up towards tray 20, a second free end of each pin 58 may eventually deflect downwards back towards circuit board 50. For example, as shown, a free end 57 of each electrical pin 58 may be free and may be biased to deflect downwards towards circuit board 50. In some embodiments, circuit board 50 may include one or more detents 55 (e.g., one or more gaps, holes, or at least recesses), each of which may allow a free end 57 of a pin 58 to pass therethrough or at least deflect therein. The additional deflection afforded to pins 58 by detents 55 of circuit board 50 may prevent pins 58 from being permanently deformed as a result of a strong downward force exerted by tray 20 and/or module 30 on pins 58 toward board 50. When tray 20 is being removed from device 10, free pin ends 57 may deflect upwards away from board 50, but, due to the additional downward deflection afforded to pins 58 by detents 55, pins 58 may be biased such that free pin ends 57 may not deflect upwards so much so that they can be snagged by tray 20 upon its removal.

Assembly 16 may also include tray detect mechanism 70, which may include one or more detect springs (e.g., detect springs 72 and 74) that may make contact with tray 20 and/or each other when tray 20 is fully inserted into device 10. Each one of the detect springs of tray detect mechanism 70 may be electrically coupled to circuit board 50 (e.g., at one or more respective circuit board couplings 59 (e.g., copper signal pads via solder)). Each one of detect springs 72 and 74 may be directly soldered or otherwise connected to a respective circuit board coupling 59 (e.g., via one or more coupling elements 49 (e.g., screws, solder, adhesives, mechanical tabs, etc.)). For example, in some embodiments, coupling elements 49e and 49f may couple a one of respective detect springs 72 and 74 to a respective one of circuit board couplings 59e and 59f. Each one of circuit board couplings 59e and 59f may be electrically coupled to an appropriate electrical via of circuit board 50 for detecting tray 20 when it is fully inserted into device 10.

In some embodiments, a recess or pocket 53 may be formed into circuit board 50 (e.g., by removing a portion of top surface 52). For example, pocket 53 may expose a middle surface 54 of circuit board 50. Middle surface 54 may be a surface formed by a portion of a non-conductive substrate of circuit board 50 that may run below top surface 52 of circuit board 50. The depth D of pocket 53 (e.g., the distance between middle surface 54 and top surface 52 along an edge of pocket 53 (e.g., along the Z axis) may be any suitable depth, such as in the range of 0.1 millimeters to 0.9 millimeters, or in the range of 0.3 millimeters to 0.7 millimeters, or in the range of 0.45 millimeters to 0.55 millimeters, or may be about 0.50 millimeters (see, e.g., FIG. 5). In other embodiments, the depth D of pocket 53 may be much larger or much smaller. Pocket 53 may help to reduce the geometry of device 10 (e.g., the height of device 10 along the Z axis) by forming at least a portion of the space between cover 40 and circuit board 50 within which tray 20 may be inserted for functionally aligning module 30 with pins 58. It is to be understood that middle surface 54 need not be exactly in the middle of circuit board 50 between top surface 52 and a bottom surface 51 of circuit board 50. Instead, middle surface 54 may generally be formed at any depth D between top surface 52 and bottom surface 51 of circuit board 50. Moreover, pocket 53 may be exposed through or end at a side surface 50s of board 50 (e.g., a side surface 50s that may extend from bottom surface 51 to top surface 52 in an X-Z plane). At pocket 53, side surface 50s may only extend from bottom surface 51 to middle surface 54. Pocket 53 may be formed in any suitable manner. For example, pocket 53 can be machined away after one or more of the FR-4 (e.g., a glass epoxy) and/or copper layers of board 50 are formed. Alternatively or additionally, pocket 53 may be formed by fixturing a die in a space where pocket 53 is to be formed, such that during the layering of various layers of board 50 (e.g., copper and/or FR-4 layers, the die will leave behind the pocketed geometry of pocket 53. Top surface 52 of board 50 may have a black soldermask adhered over it for cosmetic purposes. Middle surface 53 may be an exposed FR-4 or glass-reinforced epoxy laminate layer of board 50, which may have no soldermask.

As shown, one or more of circuit board couplings 59 may be formed in or on top surface 52 of circuit board 50. Additionally or alternatively, one or more of circuit board couplings 59 may be formed in or on middle surface 54 of circuit board 50 within pocket 53. For example, as shown, circuit board couplings 59a and 59b may be formed in or on middle surface 54 of circuit board 50 within pocket 53, while circuit board couplings 59c, 59d, 59e, and 59f may be formed in or on top surface 52 of circuit board 50 (e.g., about the periphery of pocket 53). Therefore, legs 44a and 44b of cover 40 may be longer than legs 44c and 44d such that top cover portion 42 may remain substantially parallel with the exposed surfaces of circuit board 50 that face top cover portion 42 (e.g., top surface 52 and/or middle surface 54). Moreover, one or more of circuit board couplings 56 may be formed in or on top surface 52 of circuit board 50. Additionally or alternatively, one or more of circuit board couplings 56 may be formed in or on middle surface 54 of circuit board 50 within pocket 53. For example, as shown, circuit board couplings 56 may be formed in or on middle surface 54 of circuit board 50. Moreover, one or more of detents 55 may be formed through top surface 52 of circuit board 50. Additionally or alternatively, one or more of detents 55 may be formed through middle surface 54 of circuit board 50 within pocket 53. For example, as shown, detents 55 may be formed through middle surface 54 of circuit board 50. One or more of couplings 56 and/or one or more of couplings 59 may be formed by layering in between FR-4 layers, but couplings 56 may be tied to signal lines of board 50 and couplings 59 may be tied to ground.

Cover 40 and circuit board 50 may collectively define a receiving assembly for receiving, guiding, and holding tray 20 and/or module 30 within device 10. While top cover portion 42 of cover 40 may limit the movement of tray 20 in the "Z" direction (e.g., along the Z axis) above and away from circuit board 50, signal springs 58 and circuit board 50 may limit the movement of tray 20 in the "Z" direction (e.g., along the Z axis) below and toward cover portion 42, and cover legs 49 and biasing mechanisms 84 may limit the movement of tray 20 in at least the "X" directions (e.g., along the X axis). Assembly 70 may limit the movement of tray 20 in the "Y" direction (e.g., along the Y axis).

Figure 5:
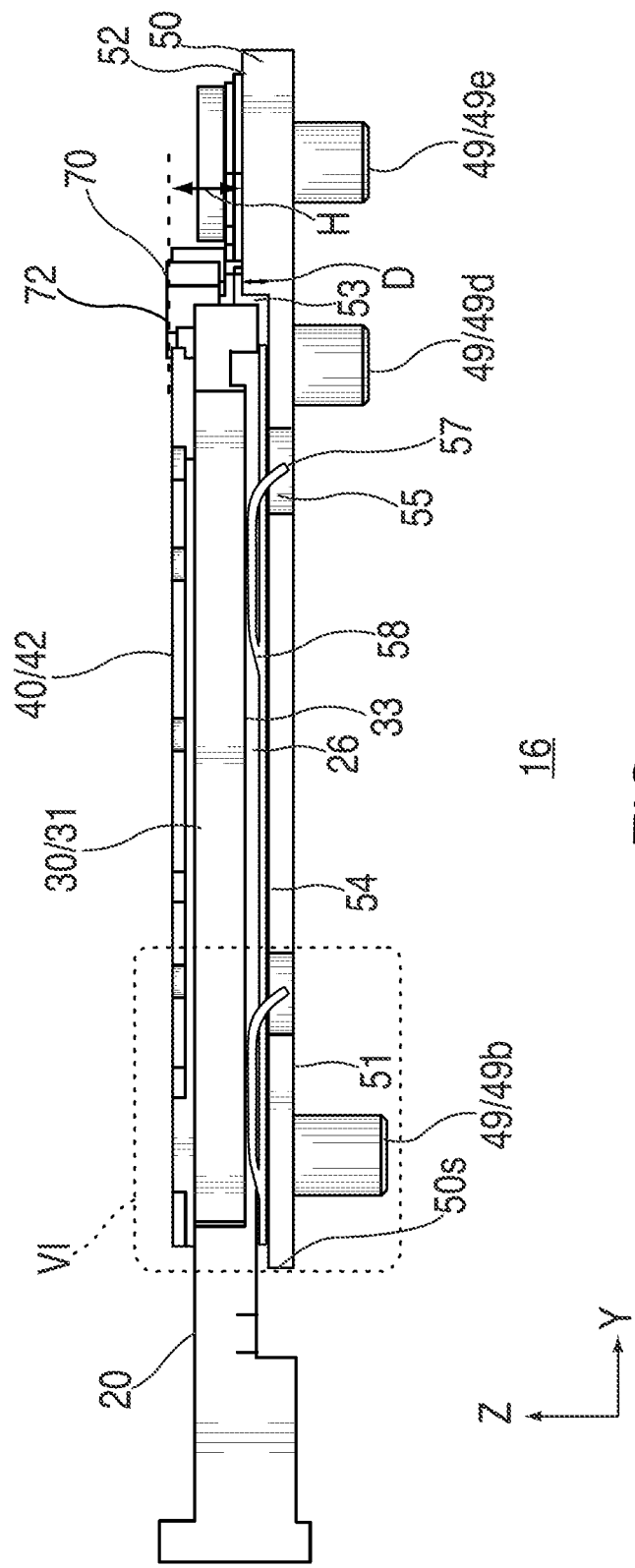
FIG. 5 is a cross-sectional view of the ejectable component assembly and electronic device of FIGS. 1-4, taken from line V-V of FIG. 4, in accordance with some embodiments of the invention.
Figure 6:
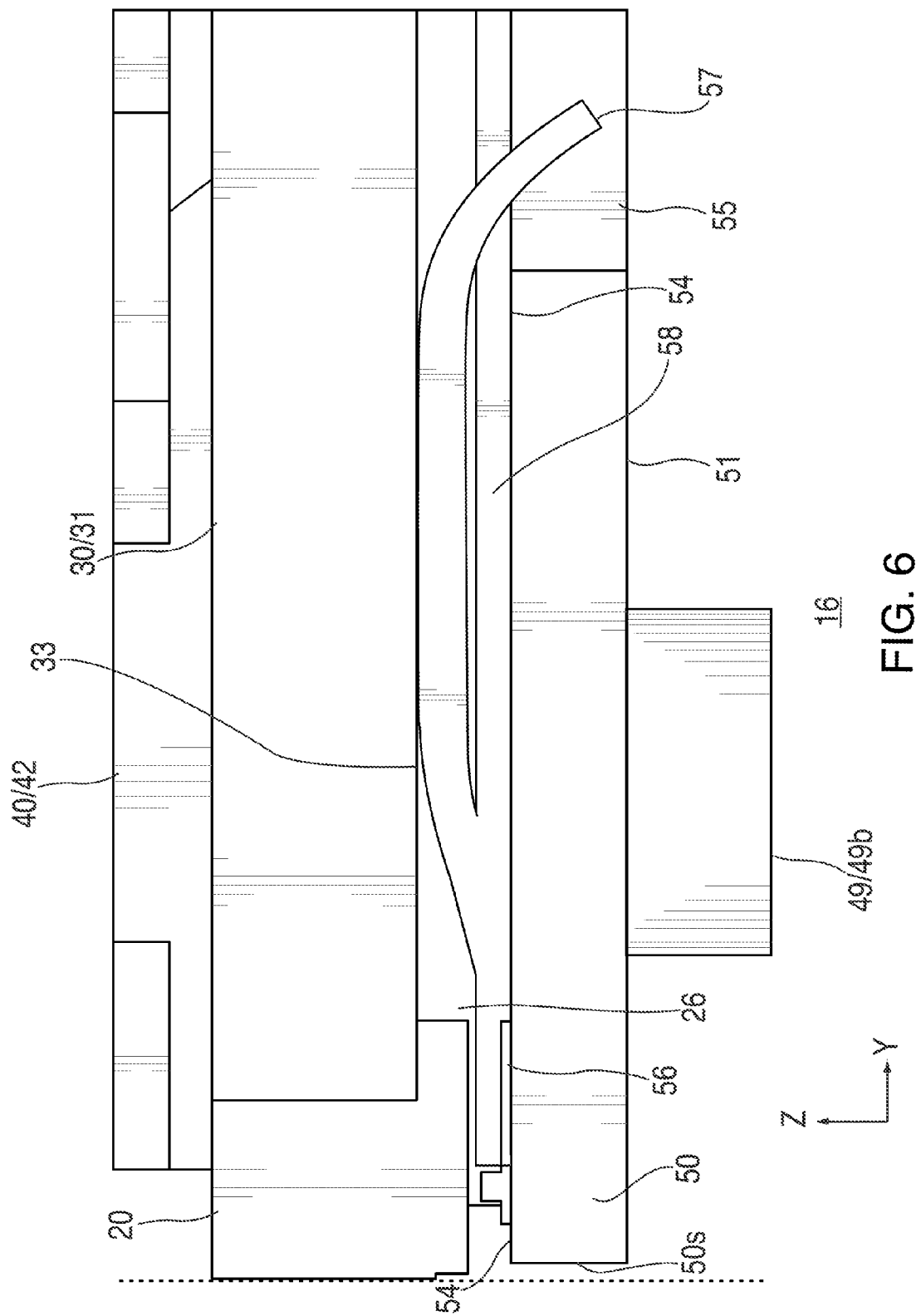
FIG. 6 is a cross-sectional view of the ejectable component assembly and electronic device of FIGS. 1-5, showing in more detail called-out area VI of FIG. 5, in accordance with some embodiments of the invention.
Figure 7:
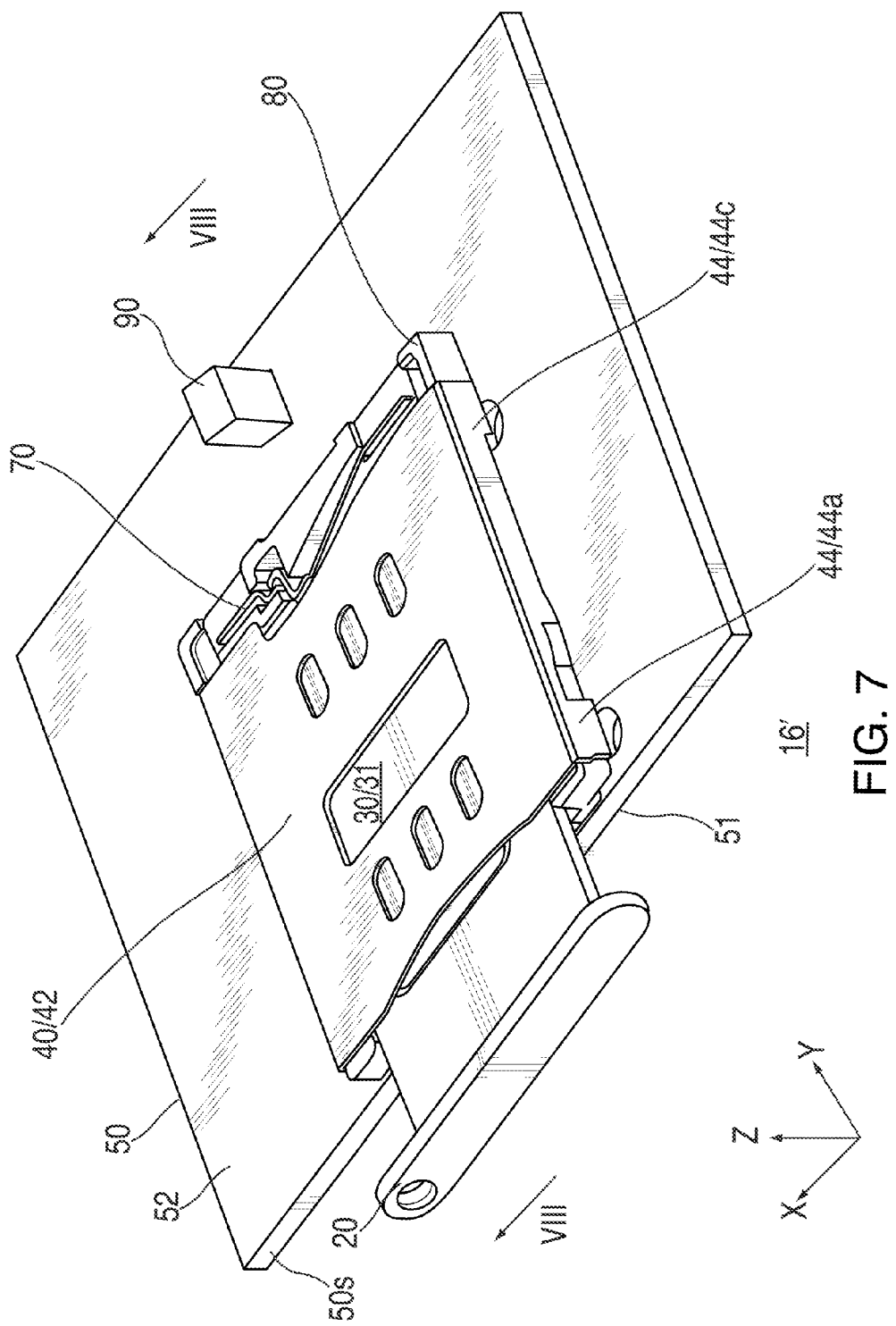
FIG. 7 is a perspective view of another ejectable component assembly and a portion of another electronic device, similar to FIG. 2, in accordance with some embodiments of the invention.
Figure 8:
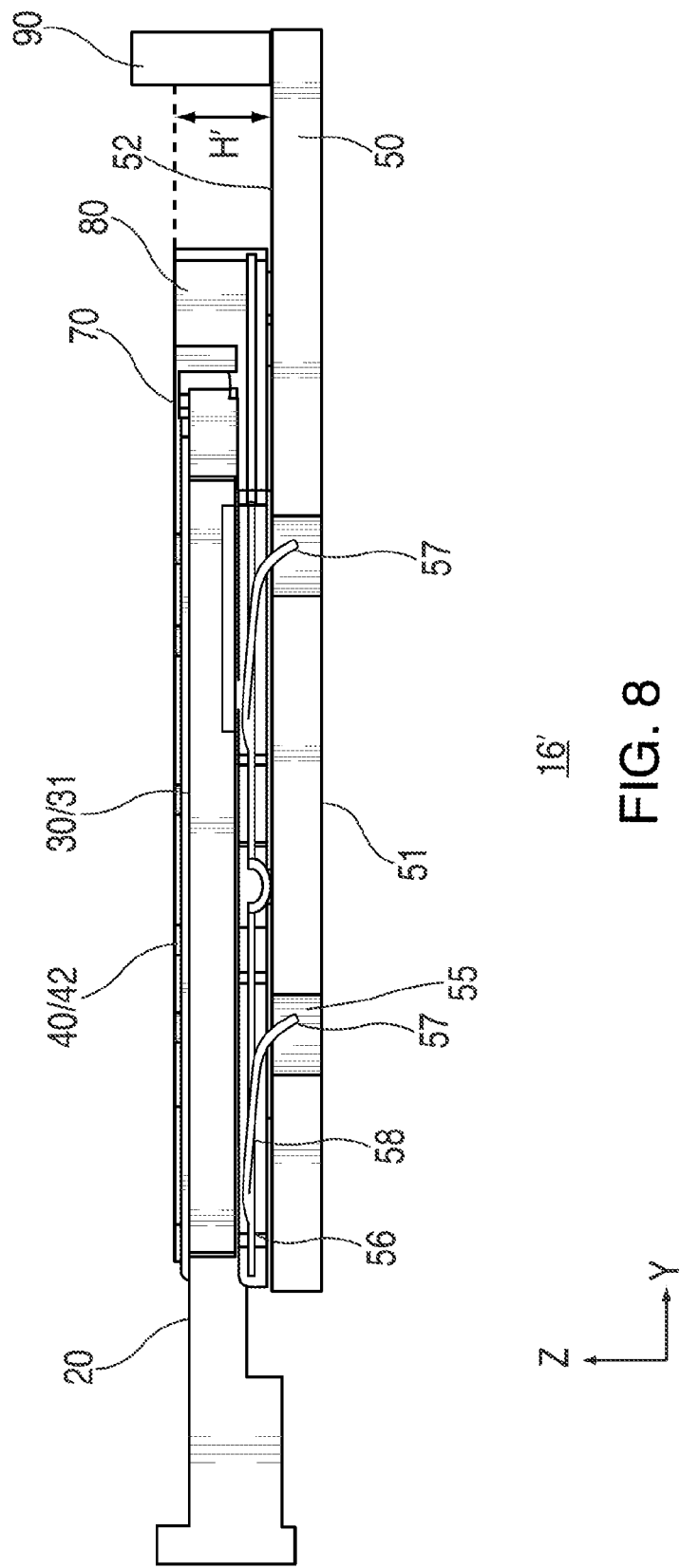
FIG. 8 is a cross-sectional view of the ejectable component assembly and electronic device of FIG. 7, taken from line VIII-VIII of FIG. 7, in accordance with some embodiments of the invention.

As shown in FIG. 5, a height H between top surface 52 of circuit board 50 and top cover portion 42 of assembly 16 of FIGS. 1-6 may be less than a height H' between top surface 52 of circuit board 50 and top cover portion 42 of assembly 16' of FIGS. 7 and 8. Assembly 16' may be similar to assembly 16, except that assembly 16' may not include a pocket 53 in circuit board 50, such that tray 20 is positioned between top cover portion 42 and top surface 52 of circuit board 50. Whereas, in assembly 16, at least a portion of tray 20 may be positioned within pocket 53 between middle surface 54 of circuit board 50 and top cover portion 42 (i.e., in assembly 16, at least a portion of tray 20 may be positioned within pocket 53 between middle surface 54 of circuit board 50 and top surface 52 of circuit board 50). For example, in some embodiments, height H may be about 1.00 millimeters, while height H' may be about 1.55 millimeters. Moreover, in some embodiments, assembly 16' may also include a connector 80 that may be coupled to top surface 52 of circuit board 50, while connector 80 may support electrical pins 58 and couplings 56 and 59, such that they are not directly coupled to circuit board 50.

As described above, cover 40 may be operative to engage and retain tray 20. For example, cover 40 can include one or more biasing mechanisms 84 that may be constructed to complement a respective tray detent 29d. Biasing mechanisms 84 may assist in guiding tray 20 into assembly 16 (e.g., towards its functional position with module 30 above pins 58) and to retain the periphery of tray 20 (e.g., the side walls of tray 20). Each detent 29d of tray 20 may be operative to receive a portion of a biasing mechanism 84 for holding tray 20 within assembly 16 at its functional position. In some embodiments, as shown, a biasing mechanism 84 may be fixed at a first end and may include a free end portion biased towards tray 20. For example, each detent 29d may be operative to receive a free end portion of a biasing mechanism 84, such that when tray 20 is fully inserted in device 10 at its functional position, a free end portion of a biasing mechanism 84 may engage a respective detent 29d. In some embodiments, the first end of each biasing mechanism 84 may be coupled to and extend from a cover leg 49 (e.g., leg 49a). In some embodiments, cover 40 may include leg 49a and a biasing mechanism 84, with top surface 42 only existing above biasing mechanism 84 for preventing movement of tray 20 away from circuit board 50 in the Z-axis at biasing mechanism 84, but cover 40 may not include a top surface 42 extending across the entirety of tray 20 along the X-axis. Each biasing mechanism 84 may be coupled to, fixed on, abut, or otherwise contact any other suitable component within device 10 besides cover 40 in other embodiments, such as circuit board 50, for example. Each biasing mechanism 84 may be of any suitable spring type, such as a tension spring, extension spring, compression spring, torsional spring, wire spring, coil spring, flat spring, cantilever spring, helical spring, hairspring, balance spring, leaf spring, or any combination thereof, as to effectively assist in retaining tray 20. Each biasing mechanism 84 may be formed of any suitable material, such as stainless steel and the like.

It is to be understood that, although ejectable component assembly 16 has been described as including a cover 40 and a tray 20 for loading a removable module 30 at least partially within the space defined between cover 40 and circuit board 50, tray 20 may be unnecessary and any removable module to be inserted into device 10 may be shaped with the features of tray 20. For example, a removable module can be provided that may be substantially the same as removable module 30, but that also can include a first end shaped similarly to end 21 of tray 20, a second end shaped similarly to end 23 of tray 20, and detents shaped similarly to detents 29d of tray 20, such that the module may be inserted into and removed from device 10 in the same way that tray 20 may be inserted into and removed from device 10.

Figure 9:
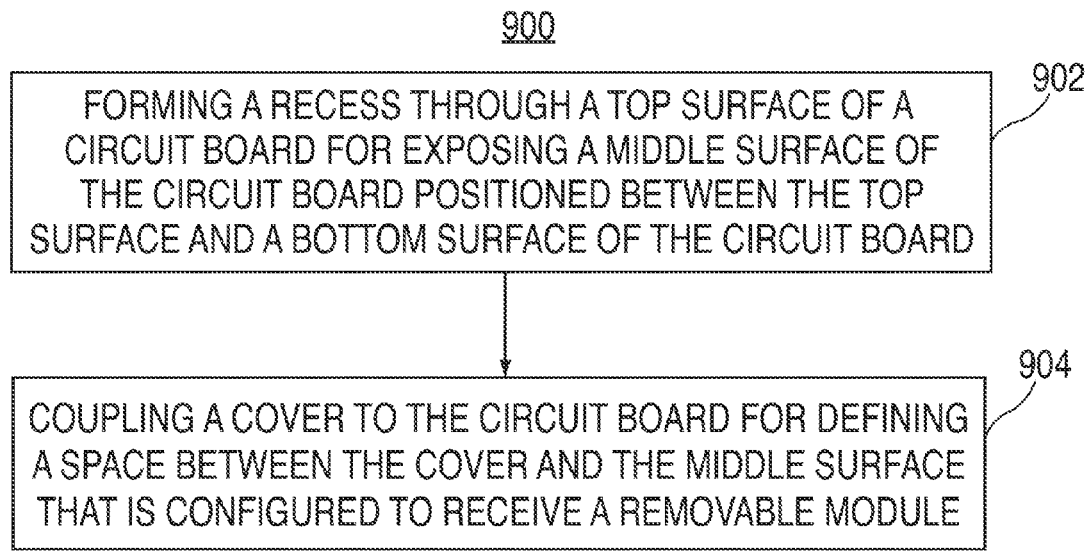
FIG. 9 a flowchart of an illustrative process for embedding an assembly in a circuit board, in accordance with some embodiments of the invention.

FIG. 9 is a flowchart of an illustrative process 900 for embedding an assembly in a circuit board. At step 902 of process 900, a recess may be formed through a top surface of a circuit board for exposing a middle surface of the circuit board positioned between the top surface and a bottom surface of the circuit board. For example, as shown in FIGS. 2-6, recess 53 may be formed through top surface 52 of circuit board 50 for exposing middle surface 51 of circuit board 50 positioned between top surface 52 and bottom surface 51 of circuit board 50. Then, at step 904 of process 900, a cover may be coupled to the circuit board for defining a space between the cover and the middle surface that is configured to receive a removable module. For example, as shown in FIGS. 2-6, cover 40 may be coupled to circuit board 50 for defining a space between top surface 42 of cover 40 and middle surface 54 of circuit board 50 that is operable to receive tray 20 and/or module 30. In some embodiments, the coupling of step 904 may include directly coupling (e.g., soldering) a first portion of the cover to the middle surface of the circuit board. In some additional embodiments, the coupling of step 904 may also include directly coupling (e.g., soldering) a second portion of the cover to the top surface of the circuit board. Process 900 may also include coupling a signal pin (e.g., pin 58) to the middle surface of the circuit board (e.g., middle surface 54 of circuit board 50) for communicating with the removable module when the removable module is received by the space.

It is understood that the steps shown in process 900 of FIG. 9 are merely illustrative and that existing steps may be modified or omitted, additional steps may be added, and the order of certain steps may be altered.

While there have been described systems and methods for providing ejectable assemblies in electronic devices, it is to be understood that many changes may be made therein without departing from the spirit and scope of the invention. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. It is also to be understood that various directional and orientational terms such as "up and "down," "front" and "back," "top" and "bottom" and "side," "length" and "width" and "thickness," "X-" and "Y-" and "Z-," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Moreover, an electronic device constructed in accordance with the principles of the invention may be of any suitable three-dimensional shape, including, but not limited to, a sphere, cone, octahedron, or combination thereof, rather than a hexahedron, as illustrated by FIGS. 1-8.

Therefore, those skilled in the art will appreciate that the invention can be practiced by other than the described embodiments, which are presented for purposes of illustration rather than of limitation.

What is claimed is:

1. An electronic device comprising:
   a housing comprising an opening;
   a tray inserted into the opening of the housing and configured to hold a removable electronic card;
   a circuit board within the housing and comprising:
      a top surface;
      a bottom surface;
      a pocket recessed into the top surface toward the bottom surface and forming a flat middle surface that is open with respect to the top surface;
      a set of electrical signal pins coupled to the middle surface; and
      one or more openings in the pocket extending through the circuit board and configured to receive a portion of the set of signal pins;
   a cover comprising a flat top portion extending across the pocket;
   wherein
   the pocket and flat top portion together define a receiving assembly that is sized to receive and hold the tray and the removable electronic card held within the tray; and
   the flat top portion is substantially parallel to the flat middle surface.

2. The electronic device of claim 1, wherein the cover is directly coupled to the middle surface of the pocket.

3. The electronic device of claim 1, wherein the removable electronic card module is one of:
   a subscriber identity module card and a memory card.

4. The electronic device of claim 1, wherein the removable electronic card is inserted into the tray that is inserted through the opening and into the receiving assembly defined between the pocket and the cover.

5. The electronic device of claim 1, further comprising a detect mechanism directly coupled to the circuit board, wherein the detect mechanism is configured to detect when the removable electronic card module is inserted into the receiving assembly.

6. The electronic device of claim 1, further comprising an electrical pin extending from the pocket and configured to communicate with the removable electronic card module when the removable electronic card module is inserted into the receiving assembly.

7. A circuit board comprising:
   a top surface;
   a bottom surface; and
   a flat middle surface parallel to the top surface and comprising a right edge and a left edge, the middle surface positioned between the top surface and the bottom surface and defining a portion of a receiving volume defined between the top surface and the middle surface and defining a portion of a coupling element recess;
   a cover coupled to the circuit board, the cover extending across the middle surface from the right edge to the left edge and comprising:
      a flat top portion that is parallel to the top surface and parallel to the middle surface;
      a first leg extending from the flat top portion and coupled to a portion of the coupling element recess; and
      a second leg extending from the flat top portion and coupled to the top surface; wherein
   the circuit board is configured to receive, within the receiving volume, at least a lower portion of a tray configured to hold a subscriber identity module.

8. The circuit board of claim 7, wherein the middle surface is configured to be directly coupled to a first portion of the cover for holding at least a second portion of the subscriber identity module between a portion of the cover and the middle surface.

9. The circuit board of claim 7, wherein the top surface is configured to be directly coupled to a second portion of the cover.

10. The circuit board of claim 7, wherein the top surface is configured to be directly coupled to a detect mechanism for detecting when the tray is received within the receiving volume.

11. The circuit board of claim 7, wherein the middle surface is configured to be directly coupled to a signal pin for communicating with the subscriber identity module when the tray is received within the receiving volume.

12. A method comprising:
    forming an open face recess through a top surface of a circuit board for exposing a planar middle surface of the circuit board positioned between the top surface and a bottom surface of the circuit board, the open face recess defining at least a portion of a tray receiving volume and at least a portion of a coupling element volume;
    coupling a set of electrical pins to the planar middle surface;
    forming one or more openings in the middle surface extending through the circuit board and configured to receive a portion of the set of signal pins; and
    coupling a cover to the circuit board over the open face and substantially parallel to the substantially planar middle surface such that the tray receiving volume has a rectangular cross-section, the tray receiving volume being defined between the planar top surface of the cover and the middle surface of the circuit board, wherein the tray receiving volume is sized to receive a tray configured to hold a removable electronic card module.

13. The method of claim 12, wherein the coupling comprises directly coupling a first portion of the cover to the middle surface of the circuit board.

14. The method of claim 13, wherein the directly coupling comprises soldering the first portion of the cover to the middle surface of the circuit board.

15. The method of claim 13, wherein the coupling comprises directly coupling a second portion of the cover to the top surface of the circuit board.

16. The method of claim 12, further comprising coupling a signal pin to the middle surface of the circuit board for communicating with the removable module when the removable module is received by the volume.

17. The circuit board of claim 7, wherein the cover further comprises a biasing mechanism configured to retain the tray within the coupling element recess.

* * * * *